(12) United States Patent
Nagawa et al.

(10) Patent No.: US 11,158,993 B2
(45) Date of Patent: Oct. 26, 2021

(54) LIGHT-EMITTING DEVICE, METHOD FOR MANUFACTURING THE SAME, AND PROJECTOR

(71) Applicants: Seiko Epson Corporation, Tokyo (JP); Sophia School Corporation, Tokyo (JP)

(72) Inventors: Michifumi Nagawa, Matsumoto (JP); Katsumi Kishino, Akiruno (JP)

(73) Assignees: Seiko Epson Corporation; Sophia School Corporation

( * ) Notice: Subject to any disclaimer, the term of this patent is extended or adjusted under 35 U.S.C. 154(b) by 33 days.

(21) Appl. No.: 16/646,652

(22) PCT Filed: Sep. 5, 2018

(86) PCT No.: PCT/JP2018/032836
§ 371 (c)(1),
(2) Date: Mar. 12, 2020

(87) PCT Pub. No.: WO2019/054244
PCT Pub. Date: Mar. 21, 2019

(65) Prior Publication Data
US 2020/0274330 A1 Aug. 27, 2020

(30) Foreign Application Priority Data

Sep. 15, 2017 (JP) ............................. JP2017-177763

(51) Int. Cl.
*H01S 5/22* (2006.01)
*H01S 5/11* (2021.01)
(Continued)

(52) U.S. Cl.
CPC ................ *H01S 5/222* (2013.01); *H01S 5/11* (2021.01); *H01S 5/2031* (2013.01); *H01L 33/08* (2013.01); *H01L 33/54* (2013.01)

(58) Field of Classification Search
CPC .......... H01S 5/11; H01S 5/2301; H01L 33/54; H01L 33/08; H01L 33/04–06; H01L 33/58
See application file for complete search history.

(56) References Cited

U.S. PATENT DOCUMENTS 5,104,824 A * 4/1992 Clausen, Jr. ........ H01L 21/3081
148/DIG. 26
5,689,603 A * 11/1997 Huth .................. H01L 31/02327
385/131

(Continued)

FOREIGN PATENT DOCUMENTS

JP 2010-135858 A 6/2010
JP 2011-527519 A 10/2011

(Continued)

*Primary Examiner* — Joshua King
(74) *Attorney, Agent, or Firm* — Harness, Dickey & Pierce, P.L.C.

(57) ABSTRACT

A light-emitting device includes: a substrate; a laminated structure provided at the substrate and having a plurality of columnar parts; and an electrode provided on a side opposite to a side of the substrate, of the laminated structure. The columnar part has: a first semiconductor layer; a second semiconductor layer having a different electrical conductivity type from the first semiconductor layer; and an active layer provided between the first semiconductor layer and the second semiconductor layer. The laminated structure has: a light propagation layer provided between the active layers of the columnar parts that are next to each other; a first low-refractive-index part provided between the light propagation layer and the substrate and having a lower refractive index than a refractive index of the light propagation layer; and a second low-refractive-index part provided between the light propagation layer and the electrode and having a lower refractive index than the refractive index of the light propagation layer.

11 Claims, 10 Drawing Sheets

(51) Int. Cl.
*H01S 5/20* (2006.01)
*H01L 33/54* (2010.01)
*H01L 33/08* (2010.01)

(56) References Cited

U.S. PATENT DOCUMENTS

| | | | | |
|---|---|---|---|---|
| 7,435,996 | B2* | 10/2008 | Jin | B82Y 20/00 |
| | | | | 257/88 |
| 8,183,576 | B2* | 5/2012 | Min | H01L 33/18 |
| | | | | 257/79 |
| 9,287,446 | B2* | 3/2016 | Yoo | H01L 33/18 |
| 10,908,487 | B1* | 2/2021 | Itoh | H04N 9/3155 |
| 2005/0006673 | A1* | 1/2005 | Samuelson | H01L 29/0665 |
| | | | | 257/232 |
| 2011/0299074 | A1* | 12/2011 | Kim | H01L 33/08 |
| | | | | 356/326 |
| 2011/0303924 | A1 | 12/2011 | Mochizuki | |
| 2012/0164767 | A1* | 6/2012 | Gasse | H01L 27/153 |
| | | | | 438/27 |
| 2013/0112945 | A1* | 5/2013 | Gilet | H01L 33/28 |
| | | | | 257/13 |
| 2015/0280062 | A1* | 10/2015 | Yoo | H01L 33/145 |
| | | | | 257/13 |
| 2016/0336487 | A1* | 11/2016 | Wang | H01L 33/507 |
| 2017/0117437 | A1* | 4/2017 | Shur | H01L 31/035236 |
| 2017/0117438 | A1* | 4/2017 | Shur | H01L 31/035236 |
| 2019/0267775 | A1* | 8/2019 | Noda | H01S 5/3063 |
| 2020/0106244 | A1* | 4/2020 | Noda | H01S 5/341 |
| 2020/0313040 | A1* | 10/2020 | Nishioka | H01L 33/44 |

FOREIGN PATENT DOCUMENTS

| | | | |
|---|---|---|---|
| JP | 2011-258855 A | | 12/2011 |
| JP | 2014-509781 A | | 4/2014 |
| KR | 20160019005 A | * | 2/2016 |
| WO | WO-2010-014032 A1 | | 2/2010 |
| WO | 2012-117247 A1 | | 9/2012 |

* cited by examiner

LIGHT-EMITTING DEVICE, METHOD FOR MANUFACTURING THE SAME, AND PROJECTOR The present application is based on, and claims priority from JP Application Serial Number 2017-177763, filed on Sep. 15, 2017, the disclosure of which is hereby incorporated by reference herein in its entirety.

BACKGROUND

1. Technical Field

The present disclosure relates to a light-emitting device, a method for manufacturing the same, and a projector.

2. Related Art

A semiconductor light-emitting device such as a semiconductor laser or LED (light-emitting diode) uses a material such as GaN-based, GaAs-based (see, for example, JP-A-2010-135858).

For example, confining light in an active layer of a semiconductor laser is an important factor that largely influences the performance of an element such as threshold current density. Increasing the difference in refractive index between the active layer and the cladding layer can increase the optical confinement factor.

However, in the light-emitting device as described above, since conditions such as lattice matching need to be considered based on the material of the active layer and the material of the substrate, material choices are greatly limited. Therefore, it is difficult to secure a difference in refractive index between the active layer and the cladding layer and to increase the optical confinement factor.

SUMMARY

An object of some aspects of the disclosure is to provide a light-emitting device having a high optical confinement factor. Alternatively, an object of some aspects of the disclosure is to provide a method for manufacturing a light-emitting device having a high optical confinement factor. Alternatively, an object of some aspects of the disclosure is to provide a projector having the foregoing light-emitting device.

A light-emitting device according to the disclosure includes:

a substrate;

a laminated structure provided at the substrate and having a plurality of columnar parts; and an electrode provided on a side opposite to a side of the substrate, of the laminated structure.

The columnar part has:

a first semiconductor layer;

a second semiconductor layer having a different electrical conductivity type from the first semiconductor layer; and an active layer provided between the first semiconductor layer and the second semiconductor layer.

The laminated structure has:

a light propagation layer provided between the active layers of the columnar parts that are next to each other;

a first low-refractive-index part provided between the light propagation layer and the substrate and having a lower refractive index than a refractive index of the light propagation layer; and a second low-refractive-index part provided between the light propagation layer and the electrode and having a lower refractive index than the refractive index of the light propagation layer.

Such a light-emitting device has a higher optical confinement factor than where the first low-refractive-index part and the second low-refractive-index part are not provided.

In the light-emitting device according to the disclosure, the first low-refractive-index part may be a void.

In such a light-emitting device, the refractive index of the first low-refractive-index part can be made lower than where the first low-refractive-index part is not a void.

In the light-emitting device according to the disclosure, the second low-refractive-index part may be a void.

In such a light-emitting device, the refractive index of the second low-refractive-index part can be made lower than where the second low-refractive-index part is not a void.

In the light-emitting device according to the disclosure, the active layer may contain gallium and nitrogen, and the light propagation layer may contain aluminum, gallium, and nitrogen.

In such a light-emitting device, by adjusting the amount of aluminum contained in the light propagation layer, the refractive index of the light propagation layer can be adjusted. For example, the refractive index of the light propagation layer can be made lower than the refractive index of the active layer.

In the light-emitting device according to the disclosure, the refractive index of the light propagation layer may be different from the refractive index of the active layer.

In such a light-emitting device, the plurality of columnar parts can manifest a photonic crystal effect.

In the light-emitting device according to the disclosure, a difference between the refractive index of the active layer and the refractive index of the light propagation layer may be smaller than a difference between the refractive index of the light propagation layer and a refractive index of air.

In such a light-emitting device, for example, even when the columnar parts have different diameters from each other due to manufacturing variation, the influence of the difference in the diameter of the columnar parts on an average refractive index (described in detail later) in a planar direction can be reduced.

In the light-emitting device according to the disclosure, the light propagation layer may be provided between the first semiconductor layers of the columnar parts that are next to each other and between the second semiconductor layers of the columnar parts that are next to each other.

A cross-sectional area in a direction orthogonal to a layer-stacking direction in which the first semiconductor layer and the active layer are stacked, between the active layers of the columnar parts that are next to each other, of the light propagation layer, may be greater than a cross-sectional area in the orthogonal direction on the side of the substrate of the light propagation layer and greater than a cross-sectional area in the orthogonal direction on the side of the electrode of the light propagation layer.

Such a light-emitting device has an even higher optical confinement factor.

In the light-emitting device according to the disclosure, the laminated structure may have a first insulating layer provided between the columnar part and the light propagation layer.

In such a light-emitting device, a current can be restrained from flowing through the light propagation layer and light can be efficiently generated in the active layer.

In the light-emitting device according to the disclosure, the laminated structure may have a second insulating layer provided between the light propagation layer and the electrode.

In such a light-emitting device, a current can be restrained from flowing through the light propagation layer and light can be efficiently generated in the active layer.

A method for manufacturing a light-emitting device according to the disclosure includes:

a step of forming a first semiconductor layer, an active layer, and a second semiconductor layer having a different electrical conductivity type from the first semiconductor layer, in this order at a substrate, and thus forming a plurality of columnar parts;

a step of embedding a predetermined material between the columnar parts that are next to each other, thus forming a light propagation layer between the active layers of the columnar parts that are next to each other, and forming a void between the substrate and the light propagation layer;

a step of etching the light propagation layer and thus forming a void between the second semiconductor layers of the columnar parts that are next to each other; and a step of forming an electrode on a side opposite to a side of the substrate of the columnar part.

Such a method for manufacturing a light-emitting device can manufacture a light-emitting device having a high optical confinement factor.

A projector according to the disclosure includes:

the light-emitting device according to the disclosure.

Such a projector can have the light-emitting device according to the disclosure.

DESCRIPTION OF EXEMPLARY EMBODIMENTS

Preferred embodiments of the disclosure will now be described in detail, using the drawings. The embodiments described below do not unduly limit the content of the disclosure described in the claims. Also, not all the configurations described below are necessarily essential elements of the disclosure.

1. First Embodiment 1.1. Light-Emitting Device

Figure 1:
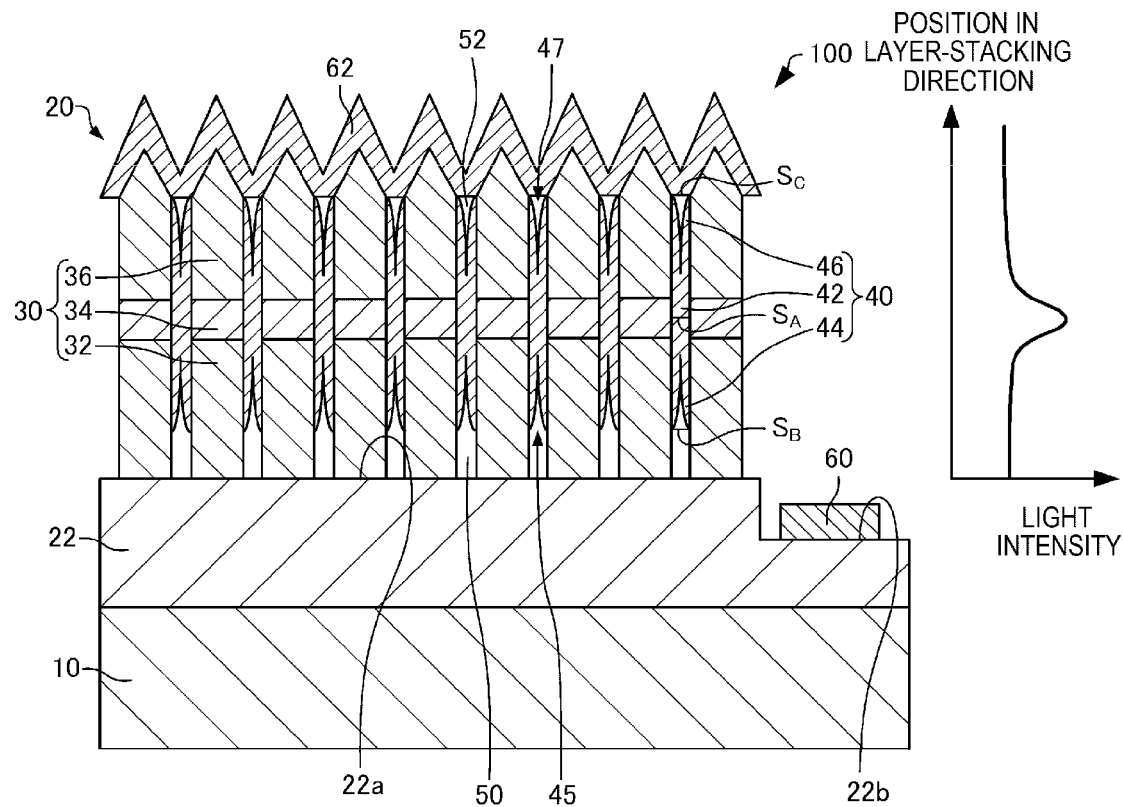
FIG. 1 is a cross-sectional view schematically showing a light-emitting device according to a first embodiment.

First, a light-emitting device according to a first embodiment will be described with reference to the drawings. FIG. 1 is a cross-sectional view schematically showing a light-emitting device 100 according to the first embodiment.

The light-emitting device 100 has a substrate 10, a laminated structure 20, a first electrode 60, and a second electrode 62, as shown in FIG. 1.

The substrate 10 has, for example, a plate-like shape. The substrate 10 is, for example, a Si substrate, GaN substrate, sapphire substrate or the like.

The laminated structure 20 is provided at the substrate 10 (over the substrate 10). The laminated structure 20 has a buffer layer 22, a columnar part 30, a light propagation layer 40, a first low-refractive-index part 50, and a second low-refractive-index part 52.

In this disclosure, "over" refers to a direction away from the substrate 10 as viewed from an active layer 34 of the columnar part 30, along a layer-stacking direction in the laminated structure 20 (hereinafter also referred to simply as a "layer-stacking direction"), and "under" refers to a direction toward the substrate 10 as viewed from the active layer 34, along the layer-stacking direction.

Also, in this disclosure, the "layer-stacking direction in the laminated structure 20" refers to the layer-stacking direction in which a first semiconductor layer 32 and the active layer 34 of the columnar part 30 are stacked (in the illustrated example, up-down direction).

The buffer layer 22 is provided over the substrate 10. The buffer layer 22 is, for example, a GaN layer having a first electrical conductivity type (for example, n-type) (specifically, a GaN layer doped with Si) or the like.

The buffer layer 22 has a first upper surface 22a and a second upper surface 22b. The first upper surface 22a is, for example, a surface where the columnar part 30 is provided. The second upper surface 22b is, for example, a surface where the first electrode 60 is provided. In the illustrated example, the second upper surface 22b is a surface located at a lower position than the first upper surface 22a.

The columnar part 30 is provided over the buffer layer 22. The planar shape (shape as viewed from the layer-stacking direction) of the columnar part 30 is, for example, a polygon such as a hexagon, or a circle or the like. The diameter of the columnar part 30 is, for example, in the order of nm and specifically 10 nm or larger and 500 nm or smaller. The columnar part 30 is also called, for example, nanocolumn, nanowire, nanorod, or nanopillar. The size in the layer-stacking direction of the columnar part 30 is, for example, 0.1 μm or larger and 5 μm or smaller.

In this disclosure, when the planar shape of the columnar part 30 is a circle, the "diameter" is the diameter of the circle. When the planar shape of the columnar part 30 is a polygon, the "diameter" is the diameter of a smallest circle enclosing this polygon (smallest enclosing circle).

The columnar part 30 is provided in a plural number. The plurality of columnar parts 30 are spaced apart from each other. The space between the columnar parts 30 that are next to each other is, for example, 1 nm or larger and 500 nm or smaller. The plurality of columnar parts 30 are arrayed at a predetermined pitch in a predetermined direction as viewed in a plan view (as viewed from the layer-stacking direction). The plurality of columnar parts 30 are arranged, for example, in the shape of a triangular lattice, square lattice or the like, as viewed in a plan view. The plurality of columnar parts 30 can manifest a photonic crystal effect.

The columnar part 30 has the first semiconductor layer 32, the active layer 34, and a second semiconductor layer 36.

The first semiconductor layer 32 is provided over the buffer layer 22. The first semiconductor layer 32 is, for example, a GaN layer having a first electrical conductivity type (for example, n-type) (specifically, a GaN layer doped with Si) or the like.

The active layer 34 is provided over the first semiconductor layer 32. The active layer 34 is provided between the first semiconductor layer 32 and the second semiconductor layer 36. The active layer 34 has, for example, a quantum well (MQW) layer formed of a GaN layer and an InGaN layer. Thus, the active layer 34 contains, for example, indium (In), gallium (Ga), and nitrogen (N). The quantum well layer has a quantum well structure. The numbers of the GaN layers and the InGaN layers forming the quantum well layer are not particularly limited. The quantum well layer is a layer that can emit light by having a current injected therein.

The active layer 34 may have guide layers sandwiching the quantum well layer. The guide layer has, for example, a semiconductor superlattice (SL) formed of a GaN layer and an InGaN layer. The guide layer has the function of increasing an overlap of the quantum well layer and light propagating in a planar direction (direction orthogonal to the layer-stacking direction) (increase the optical confinement factor).

The second semiconductor layer 36 is provided over the active layer 34. The second semiconductor layer 36 is a layer having a different electrical conductivity type from the first semiconductor layer 32. The second semiconductor layer 36 is, for example, a GaN layer having a second electrical conductivity type (for example, p-type) (specifically, a GaN layer doped with Mg) or the like. The semiconductor layers 32, 36 are cladding layers having the function of confining light in the active layer 34 (restraining light from leaking out of the active layer 34).

The light propagation layer 40 is provided between the columnar parts 30 that are next to each other. Specifically, the light propagation layer 40 is provided between the active layers 34 of the columnar parts 30 that are next to each other. In the illustrated example, the light propagation layer 40 is also provided between the first semiconductor layers 32 of the columnar parts 30 that are next to each other, and between the second semiconductor layers 36 of the columnar parts 30 that are next to each other. The light propagation layer 40 is, for example, in contact with the columnar part 30. The light generated in the active layer 34 can propagate in a planar direction through the light propagation layer 40.

The refractive index of the light propagation layer 40 is different from the refractive index of the active layer 34. The light propagation layer 40 is, for example, an AlGaN layer. Thus, the light propagation layer 40 contains, for example, aluminum (Al), gallium (Ga), and nitrogen (N). Adjusting the amount of Al contained in the light propagation layer 40 can adjust the refractive index of the light propagation layer 40. The refractive index of the light propagation layer 40 is, for example, lower than the refractive index of the active layer 34. As long as the refractive index of the light propagation layer 40 is different from the refractive index of the active layer 34, the refractive index of the light propagation layer 40 may be higher than the refractive index of the active layer 34. The difference between the refractive index of the active layer 34 and the refractive index of the light propagation layer 40 is smaller than the difference between the refractive index of the light propagation layer 40 and the refractive index of air. The difference between the refractive index of the active layer 34 and the refractive index of the light propagation layer 40 is, for example, approximately 0.1.

In this disclosure, in the case where a layer A has a laminated structure formed of a layer B and a layer C, the "refractive index of the layer A" refers to the average of the refractive index of the layer B and the refractive index of the layer C. For example, in the case where the active layer 34 has a laminated structure formed of a GaN layer and an InGaN layer, the refractive index of the active layer 34 refers to the average of the refractive index of the GaN layer and the refractive index of the InGaN layer.

A cross-sectional area SA between the active layers 34 of the columnar parts 30 that are next to each other, of the light propagation layer 40, is greater than a cross-sectional area SB on the side of the substrate 10 of the light propagation layer 40 and greater than a cross-sectional area Sc on the side of the second electrode 62 of the light propagation layer 40. The cross-sectional areas SA, SB, Scare cross-sectional areas taken when the light propagation layer 40 is cut in a direction (planar direction) orthogonal to the layer-stacking direction. The cross-sectional area SB is the cross-sectional area at the nearest position to the substrate 10 of the light propagation layer 40. The cross-sectional area Sc is the cross-sectional area at the nearest position to the second electrode 62 of the light propagation layer 40.

The light propagation layer 40 has a first part 42, a second part 44, and a third part 46. The cross-sectional area of the first part 42 of the light propagation layer 40 (cross-sectional area in the planar direction orthogonal to the layer-stacking direction) is constant in the layer-stacking direction (cross-sectional area SA). The first part 42 has, for example, a rectangular-parallelepiped shape.

The second part 44 of the light propagation layer 40 is located under the first part 42. The cross-sectional area of the second part 44 decreases as it goes toward the substrate 10 from the side of the first part 42. The second part 44 is located between the first semiconductor layers 32 of the columnar parts 30 that are next to each other. The second part 44 has a part having the cross-sectional area SB.

The third part 46 of the light propagation layer 40 is located over the first part 42. The cross-sectional area of the third part 46 decreases as it goes toward the second electrode 62 from the side of the first part 42. The third part 46 is located between the second semiconductor layers 36 of the columnar parts 30 that are next to each other. The third part 46 has a part having the cross-sectional area Sc.

The first low-refractive-index part 50 is provided between the light propagation layer 40 and the substrate 10. Specifically, the first low-refractive-index part 50 is provided between the light propagation layer 40 and the buffer layer 22. In the illustrated example, the first low-refractive-index part 50 has a part provided in a first recess 45. The first recess 45 is prescribed by the second part 44 of the light propagation layer 40. The first low-refractive-index part 50 has a lower refractive index than the light propagation layer 40. In the illustrated example, the first low-refractive-index part 50 is a void (air) surrounded by the buffer layer 22, the first semiconductor layer 32, and the light propagation layer 40. The cross-sectional area of the first recess 45 (cross-sectional area in the planar direction orthogonal to the layer-stacking direction) decreases as it goes toward the second electrode 62 from the side of the substrate 10.

The second low-refractive-index part 52 is provided between the light propagation layer 40 and the second electrode 62. In the illustrated example, the second low-refractive-index part 52 is provided in a second recess 47. The second recess 47 is prescribed by the third part 46 of the light propagation layer 40. The second low-refractive-index part 52 has a lower refractive index than the light propagation layer 40. In the illustrated example, the second low-refractive-index part 52 is a void (air) surrounded by the light propagation layer 40 and the second electrode 62. The cross-sectional area of the second recess 47 decreases as it goes toward the substrate 10 from the side of the second electrode 62.

The average refractive index in the planar direction at the part where the first low-refractive-index part 50 is provided in the laminated structure 20, and the average refractive index in the planar direction at the part where the second low-refractive-index part 52 is provided in the laminated structure 20, are lower than the average refractive index in the planar direction at the part where the active layer 34 is provided in the laminated structure 20.

Here, the "average refractive index in the planar direction" is the average refractive index in a direction orthogonal to the layer-stacking direction, at a predetermined position in the layer-stacking direction. An average refractive index RAVE in the planar direction at the part where the columnar part 30 is provided in the laminated structure 20 is expressed by the following formula (1).

Math. 1

$$n_{AVE} = \sqrt{\varepsilon_1 \cdot \phi_1 + \varepsilon_2 \cdot \phi_2 + \varepsilon_3 (1 - \phi_1 - \phi_2)} \qquad (1)$$

In the formula (1), $\varepsilon_1$ is the dielectric constant of the columnar part 30 (that is, the dielectric constant of the first semiconductor layer 32, the active layer 34, and the second semiconductor layer 36). $\varepsilon_2$ is the dielectric constant of the light propagation layer 40. $\varepsilon_3$ is the dielectric constant of the first low-refractive-index part 50 or the second low-refractive-index part 52. $\phi_1$ is the ratio $S_1/S$ of the cross-sectional area $S_1$ of the columnar part 30 in the planar direction to the cross-sectional area $S$ of the laminated structure 20 in the planar direction, at a predetermined position in the layer-stacking direction. $\phi_2$ is the ratio $S_2/S$ of the cross-sectional area $S_2$ of the light propagation layer 40 in the planar direction to the cross-sectional area $S$, at the predetermined position in the layer-stacking direction. Also, $S = S_1 + S_2 + S_3$ holds, where $S_3$ is the cross-sectional area of the first low-refractive-index part 50 or the second low-refractive-index part 52 in the planar direction, at the predetermined position in the layer-stacking direction.

In the light-emitting device 100, the p-type second semiconductor layer 36, the active layer 34 not doped with impurities, and the n-type first semiconductor layer 32 form a PIN diode. Each of the first semiconductor layer 32 and the second semiconductor layer 36 is a layer having a larger band gap than the active layer 34. In the light-emitting device 100, when a forward bias voltage of the PIN diode is applied (a current is injected) between the first electrode 60 and the second electrode 62, electron-hole recombination occurs in the active layer 34. This recombination causes light emission. The light generated in the active layer 34 is made to propagate through the light propagation layer 40 in the planar direction by the semiconductor layers 32, 36, then forms a standing wave by the photonic crystal effect of the plurality of columnar parts 30, receives a gain in the active layer 34, and performs laser oscillation. Then, the light-emitting device 100 emits positive first-order diffracted light and negative first-order diffracted light as laser beams into the layer-stacking direction (toward the second electrode 62 and toward the substrate 10).

Although not illustrated in the drawings, a reflection layer may be provided between the substrate 10 and the buffer layer 22 or under the substrate 10. The reflection layer is, for example, a DBR (distributed Bragg reflector) layer. The reflection layer can reflect the light generated in the active layer 34, and the light-emitting device 100 thus can emit the light from the side of the second electrode 62 only.

The first electrode 60 is provided over the buffer layer 22. In the illustrated example, the first electrode 60 is provided at the second upper surface 22b of the buffer layer 22. The buffer layer 22 may be in ohmic contact with the first electrode 60. The first electrode 60 is electrically coupled to the first semiconductor layer 32. In the illustrated example, the first electrode 60 is electrically coupled to the first semiconductor layer 32 via the buffer layer 22. The first electrode 60 is one electrode for injecting a current into the active layer 34. As the first electrode 60, for example, an electrode made up of a Ti layer, an Al layer, and an Au layer stacked in this order from the side of the buffer layer 22, or the like, is used.

Although not illustrated in the drawings, the laminated structure 20 may have a first contact layer between the first electrode 60 and the buffer layer 22. The first contact layer may be in ohmic contact with the first electrode 60. The first contact layer may be an n-type GaN layer. When the substrate 10 is electrically conductive, the first electrode 60 may be provided under the substrate 10, though not illustrated in the drawings.

The second electrode 62 is provide over the second semiconductor layer 36 and over the second low-refractive-index part 52. The second electrode 62 is provided on the side opposite to the side of the substrate 10, of the laminated structure 20. The second semiconductor layer 36 may be in ohmic contact with the second electrode 62. The second electrode 62 is electrically coupled to the second semiconductor layer 36. The second electrode 62 is the other electrode for injecting a current into the active layer 34. As the second electrode 62, for example, ITO (indium tin oxide) is used.

Although not illustrated in the drawings, the laminated structure 20 may have a second contact layer between the second electrode 62 and the second semiconductor layer 36. The second contact layer may be in ohmic contact with the second electrode 62. The second contact layer may be an p-type GaN layer.

Although the InGaN-based active layer 34 is described above, any type of material that can emit light by having a current injected therein can be used as the active layer 34. For example, an AlGaN-based, AlGaAs-based, InGaAs-based, InGaAsP-based, InP-based, GaP-based, AlGaP-based or similar semiconductor material can be used.

The light-emitting device 100 has, for example, the following characteristics.

In the light-emitting device 100, the laminated structure 20 has the light propagation layer 40 provided between the active layers 34 of the columnar parts 30 that are next to each other, the first low-refractive-index part 50 provided between the light propagation layer 40 and the substrate 10 and having a lower refractive index than the refractive index of the light propagation layer 40, and the second low-refractive-index part 52 provided between the light propagation layer 40 and the second electrode 62 and having a lower refractive index than the refractive index of the light propagation layer 40. Therefore, in the light-emitting device 100, the difference between the average refractive index in the planar direction at the part where the active layer 34 is provided in the laminated structure 20 and the average refractive index in the planar direction at the part where the first low-refractive-index part 50 is provided in the laminated structure 20 can be made larger than where the first low-refractive-index part 50 and the second low-refractive-index part 52 are not provided (for example, where the light propagation layer 40 fills the space between the columnar parts 30 that are next to each other) or where the light propagation layer 40 is not provided between the columnar parts 30 that are next to each other. Also, in the light-emitting device 100, the difference between the average refractive index in the planar direction at the part where the active layer 34 is provided in the laminated structure 20 and the average refractive index in the planar direction at the part where the second low-refractive-index part 52 is provided in the laminated structure 20 can be made larger. Thus, the light-emitting device 100 has a high optical confinement factor, and when the light generated in the active layer 34 propagates in the planar direction, the light can be confined in the active layer 34. Consequently, in the light-emitting device 100, the threshold current density can be reduced.

FIG. 1 schematically shows the light intensity at various positions in the layer-stacking direction in the light-emitting device 100. In the illustrated example, a peak of light intensity (peak where light intensity is at its maximum) is located at the active layer 34.

Figure 2:
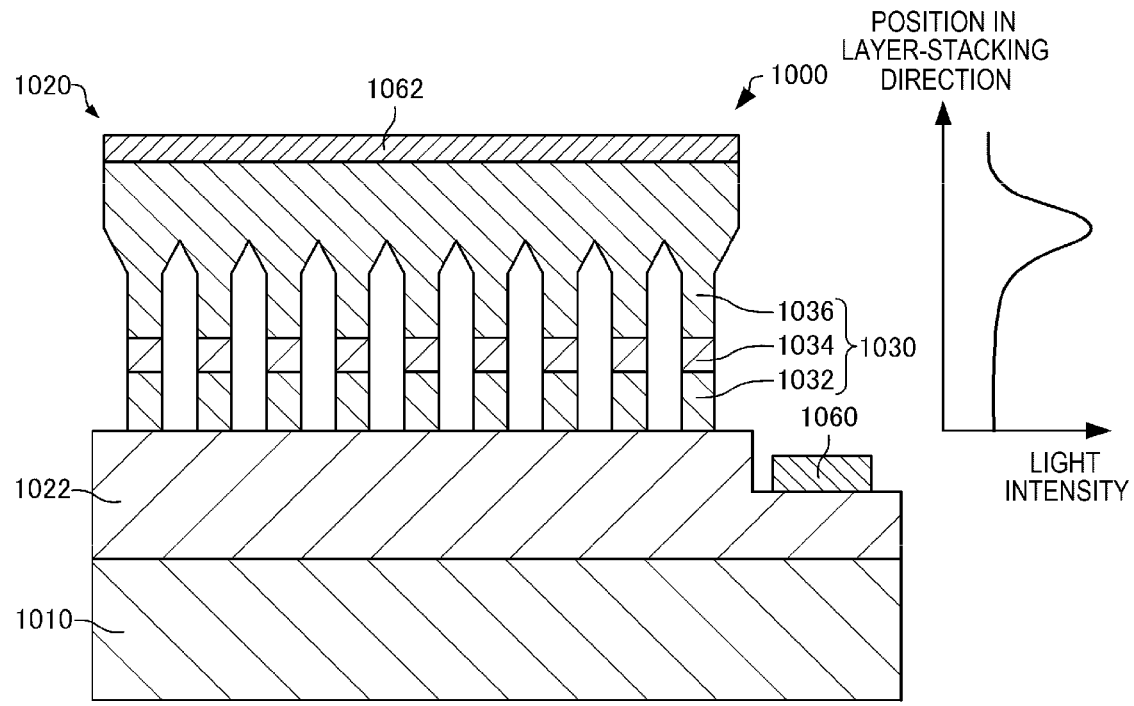
FIG. 2 is a cross-sectional view schematically showing a light-emitting device according to a reference example.

As shown in FIG. 2, in a light-emitting device 1000 (light-emitting device 1000 according to a reference example) where the light propagation layer 40 is not provided between columnar parts 1030 that are next to each other, for example, the difference between the average refractive index in the planar direction at the part where an active layer 1034 is provided in a laminated structure 1020 and the average refractive index in the planar direction at the part where a second semiconductor layer 1036 is provided in the laminated structure 1020 is small. Therefore, the light generated in the active layer 1034 may leak out toward a second electrode 1062 and be absorbed by the second electrode 1062. Meanwhile, in the light-emitting device 100, since the optical confinement factor is high as described above, the light generated in the active layer 34 can be restrained from leaking out toward the second electrode 62 and being absorbed by the second electrode 62.

The light-emitting device 1000 has a substrate 1010, the laminated structure 1020, a first electrode 1060, and the second electrode 1062. The laminated structure 1020 has a buffer layer 1022 and the columnar part 1030. The columnar part 1030 has a first semiconductor layer 1032, the active layer 1034, and the second semiconductor layer 1036. In the illustrated example, the upper parts of the second semiconductor layers 1036 of the columnar parts 1030 that are next to each other are coupled together.

Also, in the light-emitting device 100, the laminated structure 20 has a plurality of columnar parts 30. Therefore, the light-emitting device 100 can emit light with a narrow angle of radiation due to the photonic crystal effect.

In the light-emitting device 100, the first low-refractive-index part 50 is a void. Therefore, in the light-emitting device 100, the refractive index of the first low-refractive-index part 50 can be made lower than where the first low-refractive-index part 50 is not a void. Thus, the average refractive index in the planar direction at the part where the first low-refractive-index part 50 is provided in the laminated structure 20 can be made lower.

In the light-emitting device 100, the second low-refractive-index part 52 is a void. Therefore, in the light-emitting device 100, the refractive index of the second low-refractive-index part 52 can be made lower than where the second low-refractive-index part 52 is not a void. Thus, the average refractive index in the planar direction at the part where the second low-refractive-index part 52 is provided in the laminated structure 20 can be made lower.

In the light-emitting device 100, the active layer 34 contains gallium and nitrogen, and the light propagation layer 40 contains aluminum, gallium, and nitrogen. Therefore, in the light-emitting device 100, adjusting the amount of Al contained in the light propagation layer 40 can adjust the refractive index of the light propagation layer 40. For example, the refractive index of the light propagation layer 40 can be made lower than the refractive index of the active layer 34.

In the light-emitting device 100, the refractive index of the light propagation layer 40 is different from the refractive index of the active layer 34. Therefore, in the light-emitting device 100, the plurality of columnar parts 30 can manifest a photonic crystal effect.

In the light-emitting device 100, the difference between the refractive index of the active layer 34 and the refractive index of the light propagation layer 40 is smaller than the difference between the refractive index of the light propagation layer 40 and the refractive index of air. Therefore, in the light-emitting device 100, for example, even when the columnar parts 30 have different diameters from each other due to manufacturing variation, the influence of the difference in the diameter of the columnar parts 30 on the average refractive index in the planar direction can be reduced. Thus, the light-emitting device 100 can have stable properties. Also, the light-emitting device 100 can secure a manufacturing margin.

In the light-emitting device 100, the cross-sectional area SA between the active layers 34 of the columnar parts 30 that are next to each other, of the light propagation layer 40, is greater than the cross-sectional area SB on the side of the substrate 10 of the light propagation layer 40 and greater than the cross-sectional area Sc on the side of the second electrode 62 of the light propagation layer 40. Therefore, the light-emitting device 100 can have the first part 42 having the cross-sectional area SA, the second part 44 located on the side of the substrate 10 of the first part 42 and having the cross-sectional area SB, and the third part 46 located on the side of the second electrode 62 of the first part 42 and having the cross-sectional area Sc. The cross-sectional area of the second part 44 decreases as it goes toward the substrate 10 from the side of the first part 42. The cross-sectional area of the third part 46 decreases as it goes toward the second electrode 62 from the side of the first part 42. Therefore, in the light-emitting device 100, the average refractive index in the planar direction can be gently changed as it goes from the part where the first low-refractive-index part 50 is provided in the laminated structure 20 to the part where the active layer 34 is provided in the laminated structure 20. Also, in the light-emitting device 100, the average refractive index in the planar direction can be gently changed as it goes from the part where the second low-refractive-index part 52 is provided in the laminated structure 20 to the part where the active layer 34 is provided in the laminated structure 20. Thus, the light-emitting device 100 has a higher optical confinement factor than where the average refractive index in the planar direction sharply changes. For example, in the case where the low-refractive-index parts 50, 52 have a rectangular-parallelepiped shape, the average refractive index in the planar direction sharply changes.

1.2. Method for Manufacturing Light-Emitting Device

Figure 3:
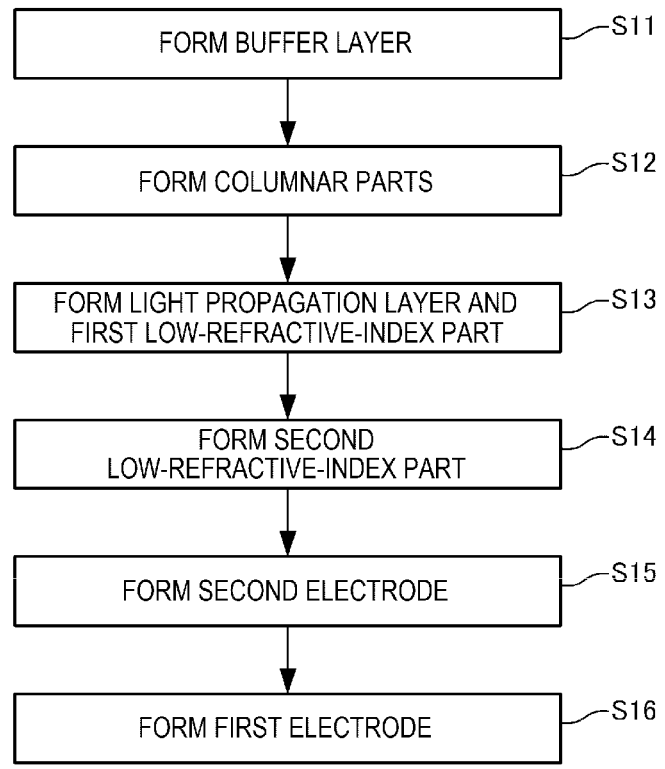
FIG. 3 is a flowchart for explaining a method for manufacturing the light-emitting device according to the first embodiment.
Figure 4:
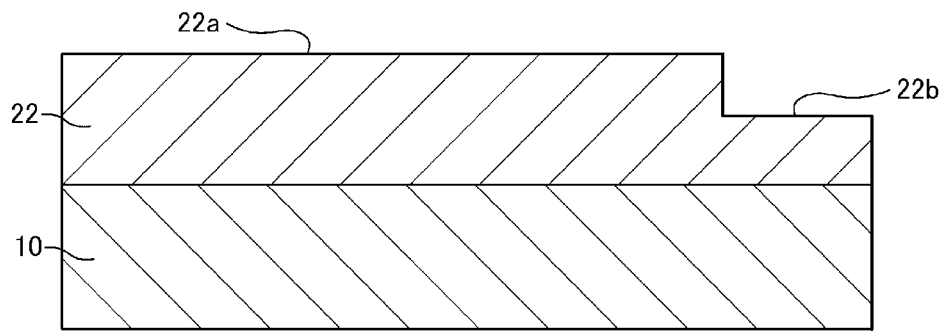
FIG. 4 is a cross-sectional view schematically showing a step of manufacturing the light-emitting device according to the first embodiment.
Figure 5:
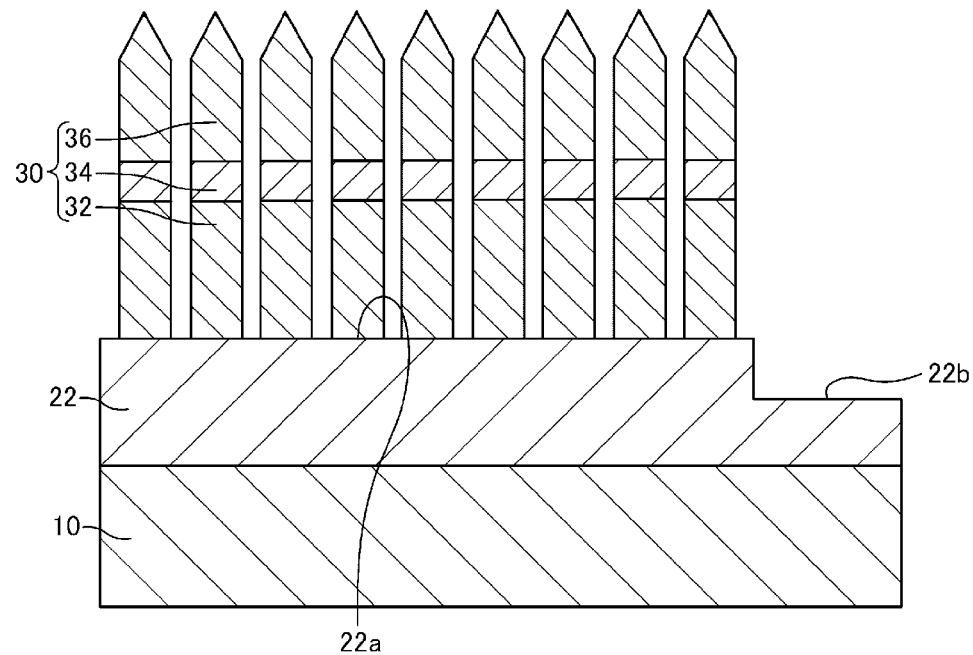
FIG. 5 is a cross-sectional view schematically showing a step of manufacturing the light-emitting device according to the first embodiment.
Figure 6:
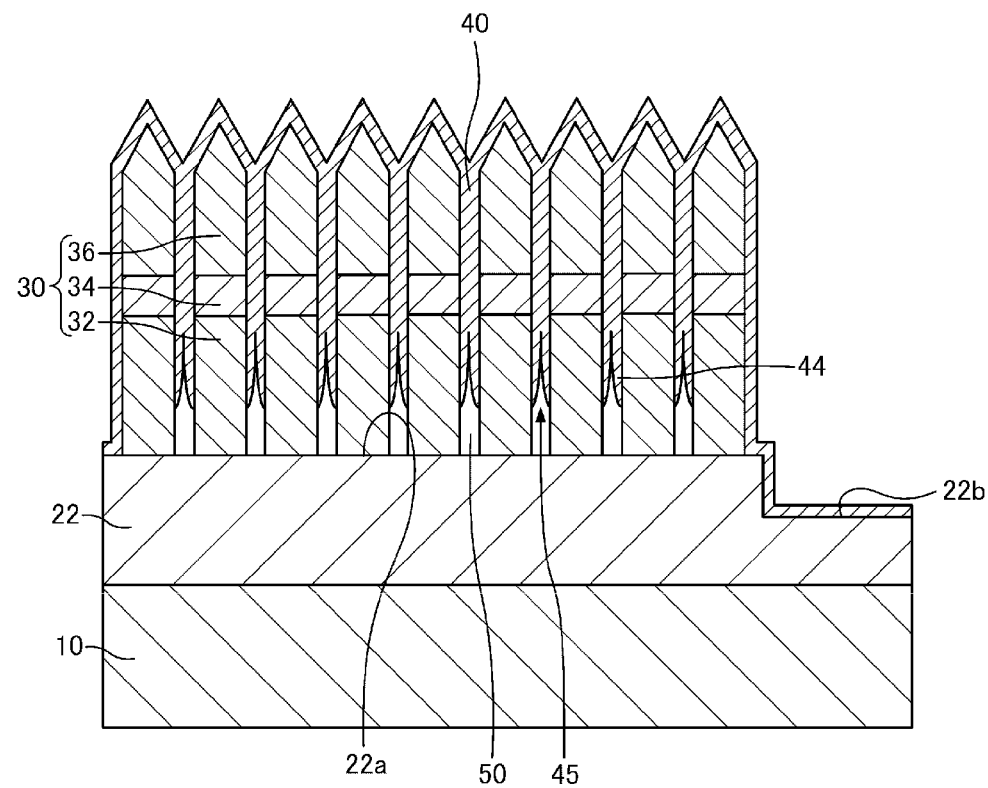
FIG. 6 is a cross-sectional view schematically showing a step of manufacturing the light-emitting device according to the first embodiment.

Next, a method for manufacturing the light-emitting device 100 according to the first embodiment will be described with reference to the drawings. FIG. 3 is a flowchart for explaining the method for manufacturing the light-emitting device 100 according to the first embodiment. FIGS. 4 to 6 are cross-sectional views schematically showing steps of manufacturing the light-emitting device 100 according to the first embodiment.

As shown in FIG. 4, the buffer layer 22 is formed over the substrate 10 (step S11). Specifically, the buffer layer 22 is epitaxially grown over the substrate 10. The method for epitaxial growth may be, for example, the MOCVD (metal organic chemical vapor deposition) method, the MBE (molecular beam epitaxy) method, or the like. Next, the buffer layer 22 is etched to expose the second upper surface 22b.

Next, a mask layer (not illustrated) is formed over the buffer layer 22. Specifically, a material layer (not illustrated) to become the mask layer is formed over the buffer layer 22. Next, a resist layer (not illustrated) is applied over the material layer, and a pattern is drawn on the resist layer by electron beam lithography and then developed. Next, the material layer is etched by an ICP (inductively coupled plasma) etching device using a Cl$_2$ gas. These steps can form the mask layer. The mask layer is, for example, a titanium (Ti) layer, titanium oxide (TiO$_2$) layer, silicon oxide (SiO$_2$) layer or the like.

As shown in FIG. 5, the first semiconductor layer 32, the active layer 34, and the second semiconductor layer 36 are formed in this order over the substrate 10 via the buffer layer 22, using the mask layer as a mask, and a plurality of columnar parts 30 are thus formed (step S12).

Specifically, the first semiconductor layer 32, the active layer 34, and the second semiconductor layer 36 are epitaxially grown in this order over the buffer layer 22. The method for epitaxial growth may be, for example, the MOCVD method, the MBE method or the like.

As shown in FIG. 6, a predetermined material (specifically, a semiconductor material to become the light propagation layer 40) is embedded between the columnar parts that are next to each other, thus forming the light propagation layer 40 between the active layers 34 of the columnar parts 30 that are next to each other, and the first low-refractive-index part (void) 50 is formed between the substrate 10 and the light propagation layer 40 (step S13).

Specifically, the semiconductor material to become the light propagation layer 40 is embedded between the columnar parts 30 that are next to each other, for example, using the MOCVD method or the like. The MOCVD method is performed, for example, under a condition that makes the growth in the planar direction easier than in step S12. Since the space between the columnar parts 30 that are next to each other is very small, for example, approximately 50 nm, the space in an upper part between the columnar parts 30 that are next to each other is filled before the semiconductor material to become the light propagation layer 40 reaches the buffer layer 22. Therefore, the first low-refractive-index part (void) 50 is formed between the light propagation layer 40 and the substrate 10. Thus, the light propagation layer 40 can have the second part 44. In the illustrated example, the light propagation layer 40 is also formed over the columnar parts 30.

As shown in FIG. 1, the light propagation layer 40 is etched to form the second low-refractive-index part (void) 52 between the second semiconductor layers of the columnar parts 30 that are next to each other (step S14).

Specifically, with an electric field applied to the columnar parts 30, the light propagation layer 40 is wet-etched using oxalic axis as an etching solution. This can selectively etch the light propagation layer 40. Since the etching in this step is isotropic etching, the light propagation layer 40 is etched in such away that its opening is broad in an upper part and becomes narrower as it goes down. Thus, the light propagation layer 40 can have the third part 46.

Next, the second electrode 62 is formed over the columnar part 30 (the side opposite to the side of the substrate 10 of the columnar part 30) (step S15).

Specifically, the second electrode 62 is formed by the vacuum deposition method or the like. In the vacuum deposition method, the material is less likely to move over to the lateral surface of the columnar part 30 and the gap between the columnar parts 30 that are next to each other is closed over the second low-refractive-index part 52 before the void of the second low-refractive-index part 52 is filled.

Next, the first electrode 60 is formed over the buffer layer 22 (step S16). The first electrode 60 is formed, for example, by the vacuum deposition method or the like. The order in which the step of forming the first electrode 60 and the step of forming second electrode 62 are performed is not particularly limited.

The foregoing steps can manufacture the light-emitting device 100.

1.3. Modification Example of Light-Emitting Device

Figure 7:
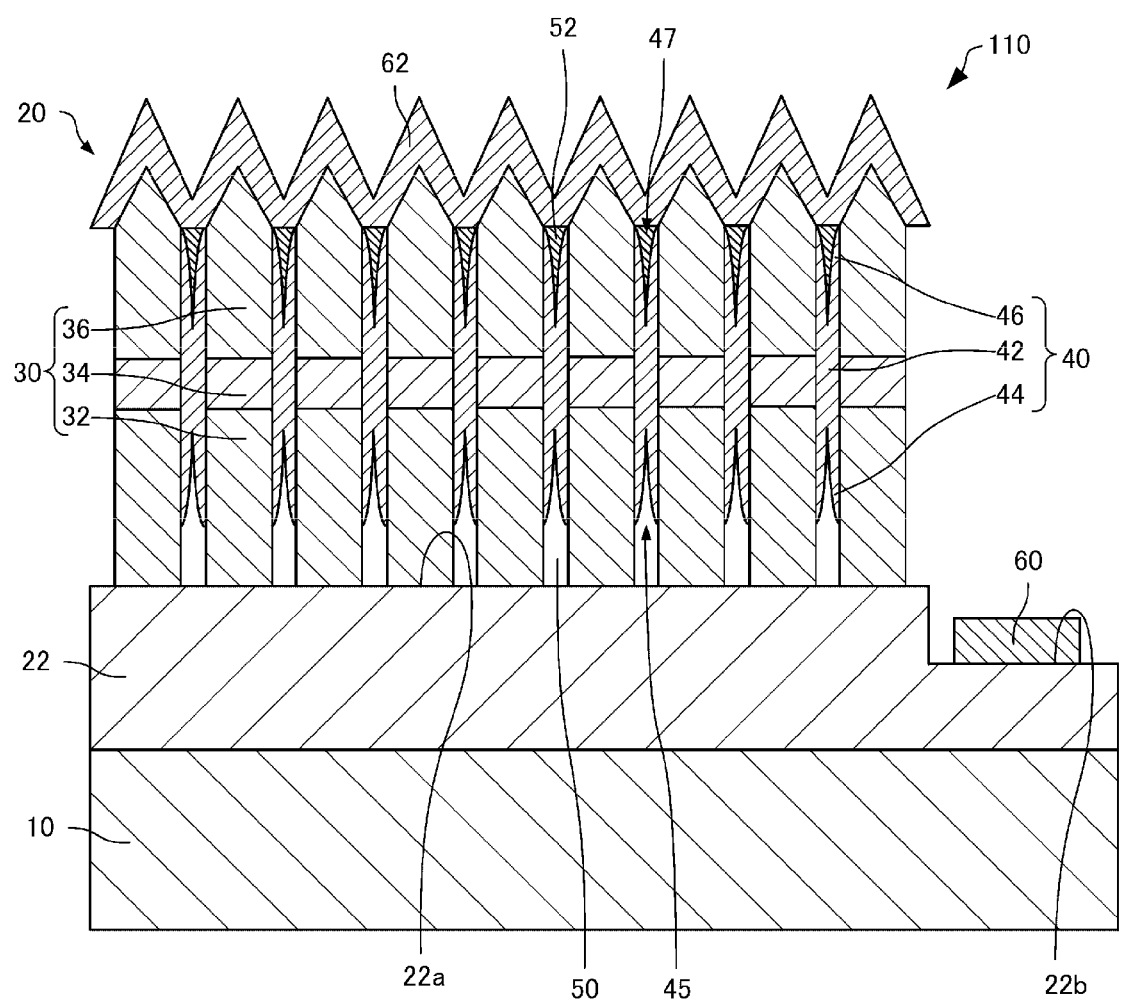
FIG. 7 is a cross-sectional view schematically showing a light-emitting device according to a modification example of the first embodiment.

Next, a light-emitting device according to a modification example of the first embodiment will be described with reference to the drawings. FIG. 7 is a cross-sectional view schematically showing a light-emitting device 110 according to the modification example of the first embodiment. In the description below, in the light-emitting device 110 according to the modification example of the first embodiment, members having functions similar to those of component members of the light-emitting device 100 according to the first embodiment are denoted by the same reference signs and detailed description thereof is omitted.

In the foregoing light-emitting device 100, the second low-refractive-index part 52 is a void, as shown in FIG. 1. Meanwhile, in the light-emitting device 110, the second low-refractive-index part 52 is not a void, as shown in FIG. 7.

In the light-emitting device 110, the second low-refractive-index part 52 is a resin layer such as a polyimide layer or BCB (benzocyclobutene) layer. The material of the second low-refractive-index part 52 is formed, for example, by the spin coating method, the CVD (chemical vapor deposition) method or the like.

The light-emitting device 110 can have effects similar to those of the light-emitting device 100.

In the light-emitting device 110, the second low-refractive-index part 52 is a resin layer. Therefore, the second electrode 62 can more securely restrained from entering the second recess 47. The entry of the second electrode 62 into the second recess 47 reduces the distance between the second electrode 62 and the part between the active layers 34 of the columnar parts 30 that are next to each other, of the light propagation layer 40, and therefore increases the possibility that the light generated in the active layer 34 may be absorbed by the second electrode 62 when propagating in the planar direction.

Although not illustrated, the first low-refractive-index part 50 and the second low-refractive-index part 52 may be resin layers. Also, the first low-refractive-index part 50 may be a resin layer and the second low-refractive-index part 52 may be a void.

2. Second Embodiment

2.1. Light-Emitting Device

Figure 8:
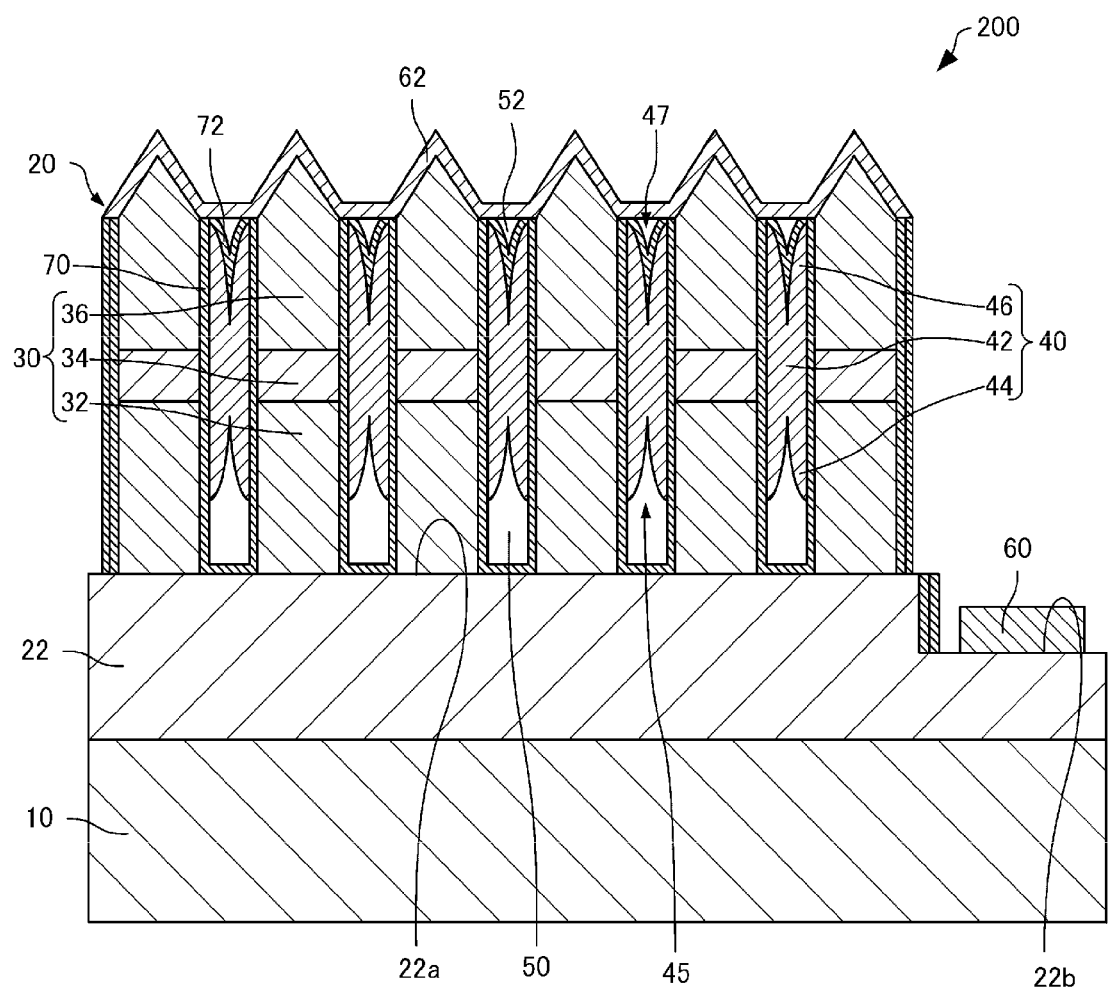
FIG. 8 is a cross-sectional view schematically showing a light-emitting device according to a second embodiment.

Next, a light-emitting device according to a second embodiment will be described with reference to the drawings. FIG. 8 is a cross-sectional view schematically showing a light-emitting device 200 according to the second embodiment. In the description below, in the light-emitting device 200 according to the second embodiment, members having functions similar to those of component members of the light-emitting device 100 according to the first embodiment are denoted by the same reference signs and detailed description thereof is omitted.

In the foregoing light-emitting device 100, the columnar part 30 and the light propagation layer 40 are in contact with each other, as shown in FIG. 1. Meanwhile, in the light-emitting device 200, the laminated structure 20 has a first insulating layer 70 provided between the columnar part 30 and the light propagation layer 40, as shown in FIG. 8.

In the illustrated example, the first insulating layer 70 is provided at the lateral surface of the columnar part 30 and over the buffer layer 22. The laminated structure 20 also has a second insulating layer 72. The second insulating layer 72 is provided over the light propagation layer 40. The second insulating layer 72 is provided between the light propagation layer 40 and the second electrode 62.

The thickness of the first insulating layer 70 and the second insulating layer 72 is, for example, 10 nm or more and 100 nm or less. The first insulating layer 70 and the second insulating layer 72 are, for example, silicon oxide (SiO$_2$) layers or the like.

The light-emitting device 200 can have effects similar to those of the foregoing light-emitting device 100.

In the light-emitting device 200, the laminated structure 20 has the first insulating layer 70 provided between the columnar part 30 and the light propagation layer 40. Therefore, in the light-emitting device 200, the columnar part 30 and the light propagation layer 40 can be insulated from each other and a current flowing through the columnar part 30 can be restrained from entering the light propagation layer 40. Thus, in the light-emitting device 200, a current can be restrained from flowing through the light propagation layer 40 and light can be efficiently generated in the active layer 34.

In the light-emitting device 200, the laminated structure 20 has the second insulating layer 72 provided between the light propagation layer 40 and the second electrode 62. Therefore, in the light-emitting device 200, a current can be restrained from flowing through the light propagation layer 40 and light can be efficiently generated in the active layer 34.

Although not illustrated, in the light-emitting device 200, the second low-refractive-index part 52 may be a resin layer, as in the foregoing light-emitting device 110.

2.2. Method for Manufacturing Light-Emitting Device

Figure 9:
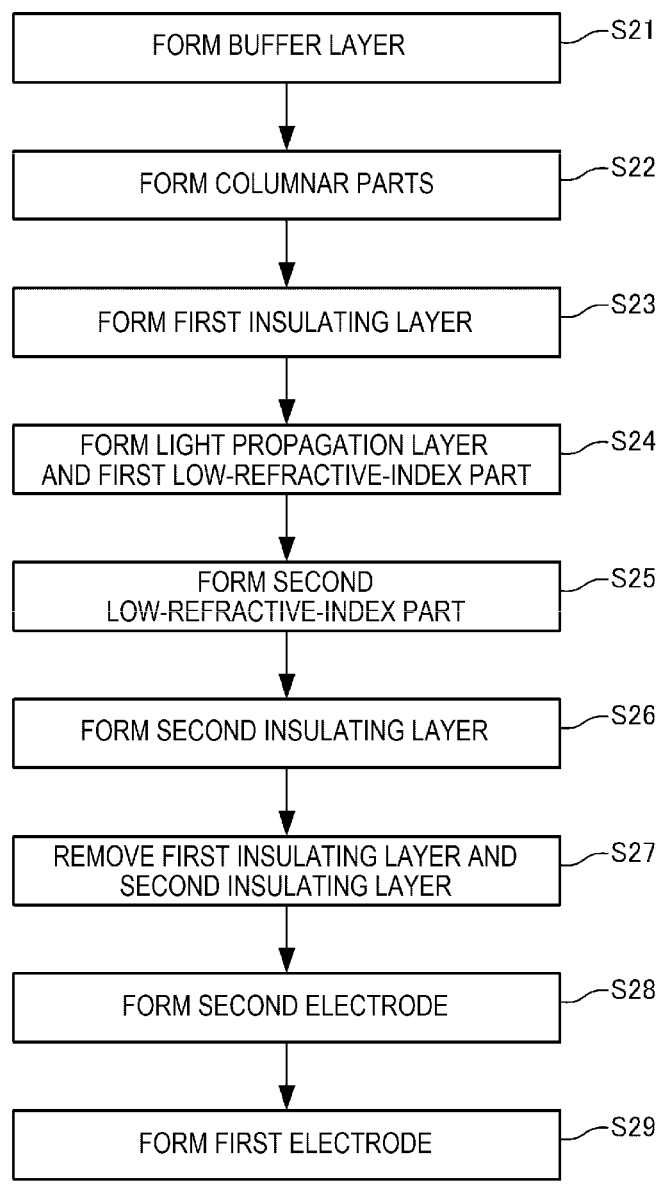
FIG. 9 is a flowchart for explaining a method for manufacturing the light-emitting device according to the second embodiment.

Next, a method for manufacturing the light-emitting device 200 according to the second embodiment will be described with reference to the drawings. FIG. 9 is a flowchart for explaining the method for manufacturing the light-emitting device 200 according to the second embodiment. FIGS. 10 to 13 are cross-sectional views schematically showing steps of manufacturing the light-emitting device 200 according to the second embodiment.

Hereinafter, the method for manufacturing the light-emitting device 200 according to the second embodiment is described in terms of difference from the example of the method for manufacturing the foregoing light-emitting device 100 according to the first embodiment, and the description of similar points is omitted or simplified.

Figure 10:
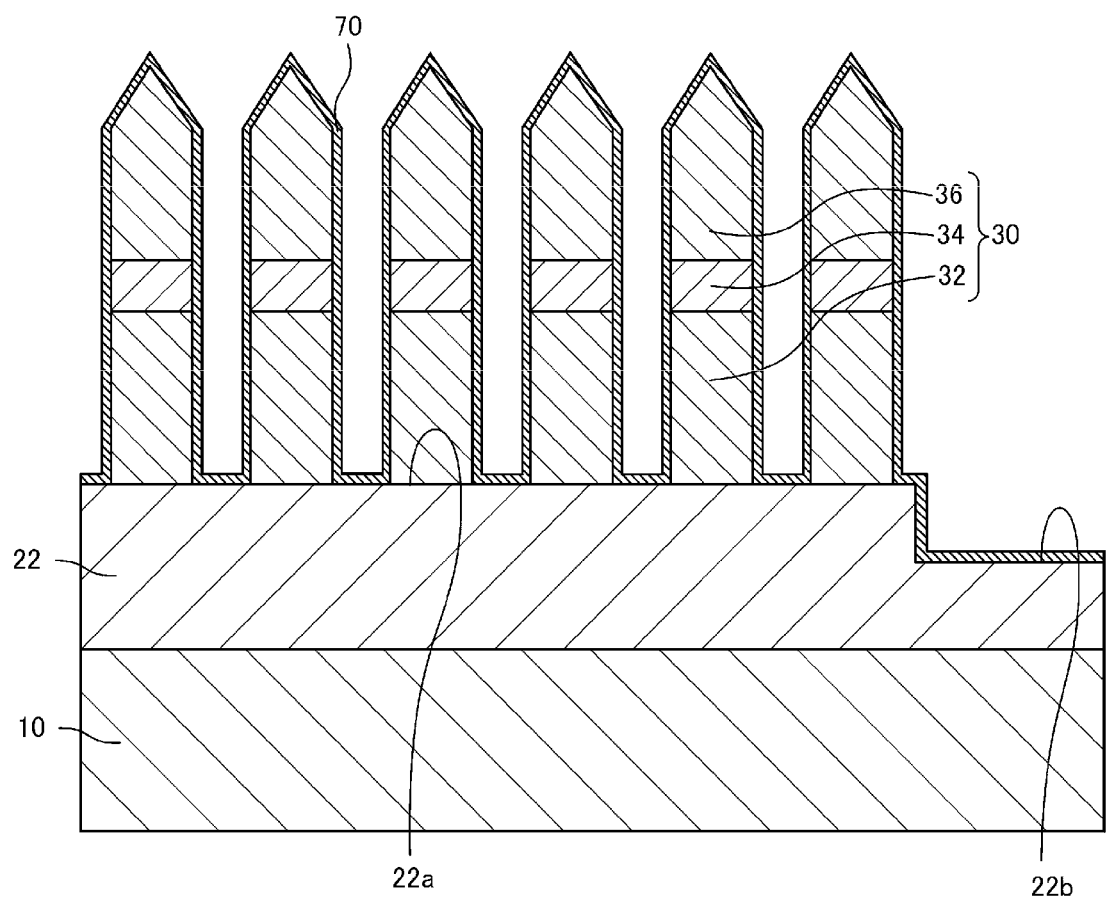
FIG. 10 is a cross-sectional view schematically showing a step of manufacturing the light-emitting device according to the second embodiment.

As shown in FIG. 10, the buffer layer 22 is formed over the substrate 10 (step S21). Next, a mask layer (not illustrated) is formed over the buffer layer 22.

Next, the first semiconductor layer 32, the active layer 34, and the second semiconductor layer 36 are formed in this order over the substrate 10 via the buffer layer 22, using the mask layer as a mask, and a plurality of columnar parts 30 are thus formed (step S22).

Next, the first insulating layer 70 is formed in such a way as to cover the columnar part 30 (at the lateral surface and the upper surface of the columnar part 30) (step S23). In the illustrated example, the first insulating layer 70 is also formed over the buffer layer 22. The first insulating layer 70 is formed, for example, by the ALD (atomic layer deposition) method or the like. Thus, the first insulating layer 70 can cover the columnar part 30 to its lowest part.

Figure 11:
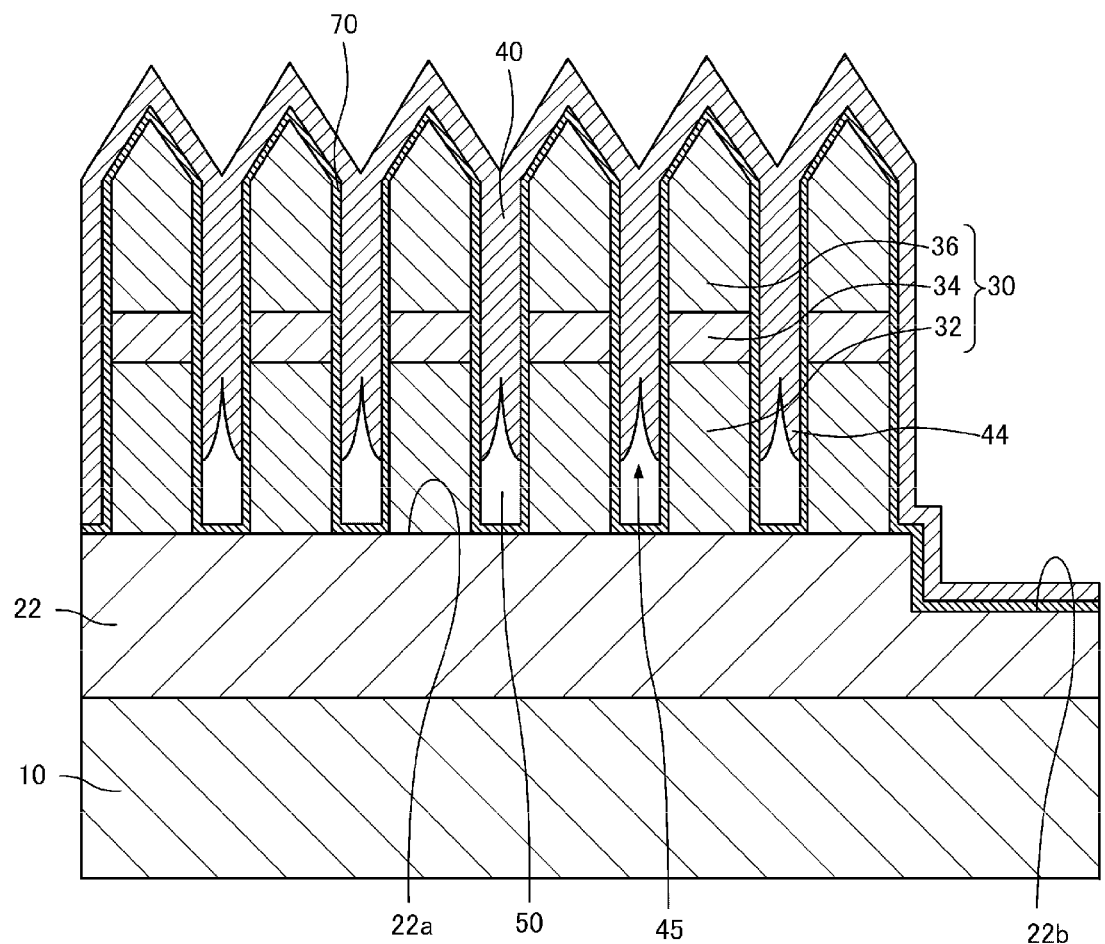
FIG. 11 is a cross-sectional view schematically showing a step of manufacturing the light-emitting device according to the second embodiment.

As shown in FIG. 11, a predetermined material (specifically, a semiconductor material to become the light propagation layer 40) is embedded between the columnar parts that are next to each other, thus forming the light propagation layer 40 and the first low-refractive-index part 50 (step S24).

Figure 12:
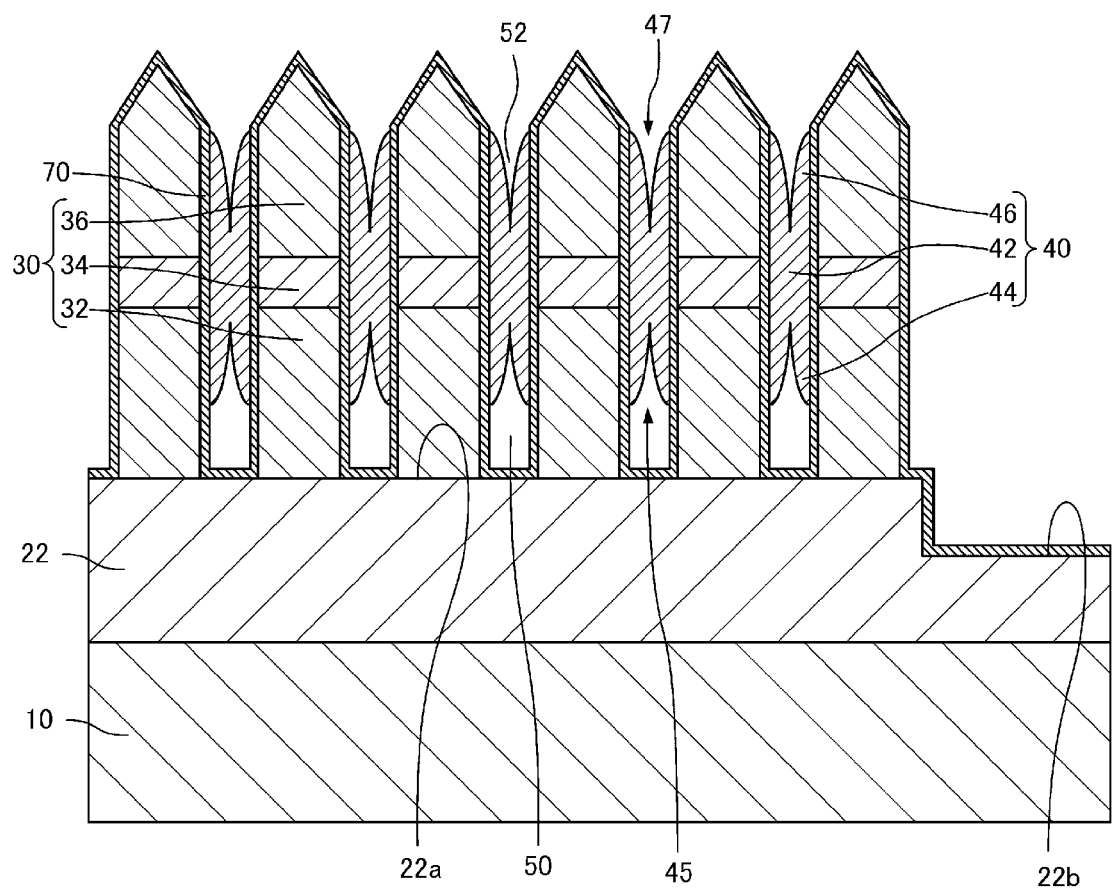
FIG. 12 is a cross-sectional view schematically showing a step of manufacturing the light-emitting device according to the second embodiment.

As shown in FIG. 12, the light propagation layer 40 is etched to form the second low-refractive-index part 52 between the second semiconductor layers of the columnar parts 30 that are next to each other (step S25).

Figure 13:
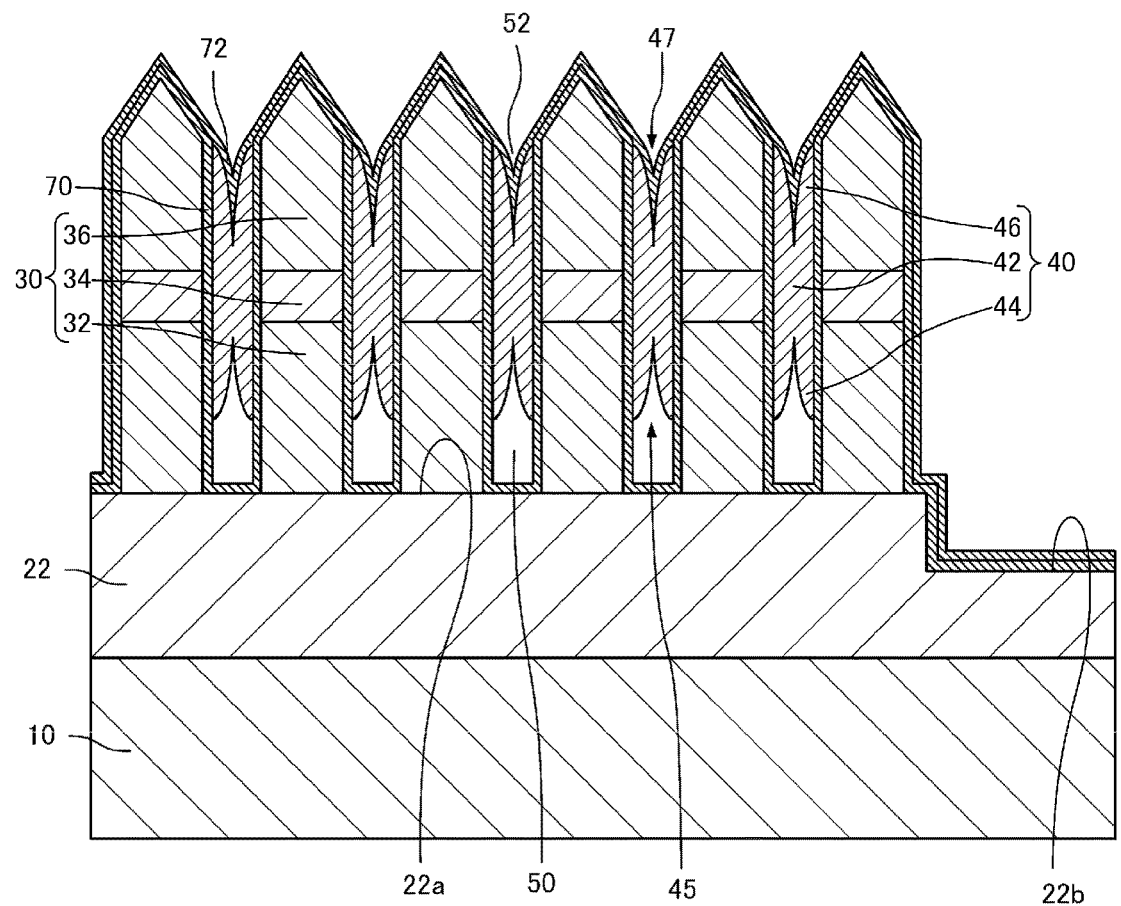
FIG. 13 is a cross-sectional view schematically showing a step of manufacturing the light-emitting device according to the second embodiment.

As shown in FIG. 13, the second insulating layer 72 is formed over the light propagation layer 40 (step S26). In the illustrated example, the second insulating layer 72 is also formed over the first insulating layer 70 provided over the columnar part 30. The second insulating layer 72 is formed, for example, by the ALD method or the like.

As shown in FIG. 8, the first insulating layer 70 and the second insulating layer 72 over the columnar part 30 are removed (step S27). Specifically, the insulating layers 70, 72 are removed to expose the upper surface of the columnar part 30 by anisotropic etching using an RIE (reactive-ion etching) device. Since a plasma generated by the RIE etching device is less likely to enter between the columnar parts 30 that are next to each other, the second insulating layer 72 remains over the light propagation layer 40.

Next, the second electrode 62 is formed over the columnar part 30 (step S28).

Next, the first insulating layer 70 over the buffer layer 22 is etched to expose the second upper surface 22$b$, and the first electrode 60 is formed at the second upper surface 22$b$ (step S29).

The foregoing steps can manufacture the light-emitting device 200.

3. Third Embodiment

Figure 14:
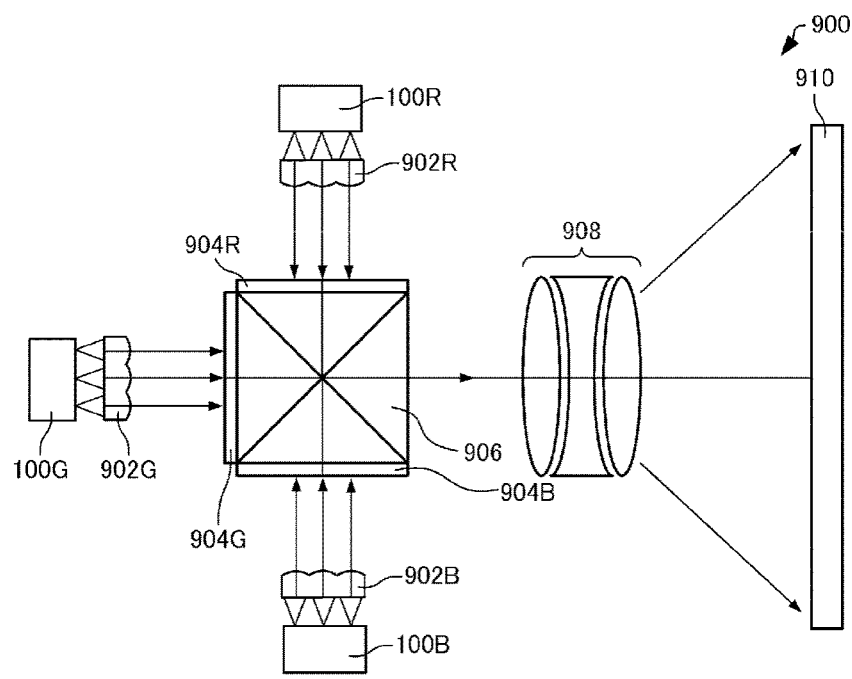
FIG. 14 is a view schematically showing a projector according to a third embodiment.

Next, a projector according to a third embodiment will be described with reference to the drawings. FIG. 14 is a view schematically showing a projector 900 according to the third embodiment.

The projector according to the disclosure has the light-emitting device according to the disclosure. Hereinafter, the projector 900 having the light-emitting device 100 as the light-emitting device according to the disclosure will be described.

The projector 900 has a casing (not illustrated), and a red light source 100R, a green light source 100G, and a blue light source 100B provided inside the casing and emitting red light, green light, and blue light, respectively. Each of the red light source 100R, the green light source 100G, and the blue light source 100B is formed of, for example, a plurality of light-emitting devices 100 arranged in the form of an array in a direction orthogonal to the layer-stacking direction, with the substrate 10 shared as a common substrate among the plurality of light-emitting devices 100. The number of the light-emitting devices 100 forming each of the light sources 100R, 100G, 100B is not particularly limited. In FIG. 14, for the sake of convenience, the casing forming the projector 900 is omitted and the light sources 100R, 100G, 100B are simplified.

The projector 900 also has lens arrays 902R, 902G, 902B, transmission-type liquid crystal light valves (light modulation devices) 904R, 904G, 904B, and a projection lens (projection device) 908, provided inside the casing.

The light emitted from the light sources 100R, 100G, 100B becomes incident on the respective lens arrays 902R, 902G, 902B. The light emitted from the light sources 100R, 100G, 100B is condensed by the lens arrays 902R, 902G, 902B, and for example, can be superimposed (partly superimposed). Thus, the liquid crystal light valves 904R, 904G, 904B can be irradiated with high uniformity.

The light condensed by the respective lens arrays 902R, 902G, 902B becomes incident on the respective liquid crystal light valves 904R, 904G, 904B. The respective liquid crystal light valves 904R, 904G, 904B modulate the incident light respectively according to image information. Then, the projection lens 908 enlarges and projects an image formed by the liquid crystal light valves 904R, 904G, 904B onto a screen (display surface) 910.

The projector 900 can also have a cross dichroic prism (light combining unit) 906 combining together the light emitted from the liquid crystal light valves 904R, 904G, 904B and guiding the light to the projection lens 908.

The three color lights modulated by the respective liquid crystal light valves 904R, 904G, 904B become incident on the cross dichroic prism 906. This prism is formed by four right-angle prisms bonded together, and a dielectric multilayer film reflecting red light and a dielectric multilayer film reflecting blue light are arranged in the shape of a cross at the inner surfaces of the right-angle prisms. The three color lights are combined together by these dielectric multilayer films, thus forming light that represents a color image. The combined light is projected onto the screen 910 by the projection lens 908 as a projection system, and an enlarged image is thus displayed.

The light sources 100R, 100G, 100B may also control (modulate) the light-emitting devices 100 forming the light sources 100R, 100G, 100B as pixels of an image according to image information and thus directly form the image without using the liquid crystal light valves 904R, 904G, 904B. Then, the projection lens 908 may enlarge and project the images formed by the light sources 100R, 100G, 100B, onto the screen 910.

Also, while the transmission-type liquid crystal light valve is used as the light modulation device in the above example, a light valve other than liquid crystal may be used, or a reflection-type light valve may be used. Such a light valve may be, for example, a reflection-type liquid crystal light valve or digital micromirror device. Also, the configuration of the projection system is properly changed according to the type of the light valve used.

Also, the light sources 100R, 100G, 100B can be applied to alight source device of a scanning-type image display device (projector) having a scanning unit as an image forming device which scans the screen with the light from the light sources 100R, 100G, 100B and thus displays an image of a desired size on the display surface.

The application of the light-emitting device according to the disclosure is not limited to the foregoing embodiments. The light-emitting device according to the disclosure can also be used as the light source of outdoor and indoor illumination, display backlight, laser printer, scanner, vehicle-installed light, sensing equipment using light, and communication device or the like, other than projector.

According to the disclosure, apart of the configurations may be omitted or various embodiments and modification examples may be combined together, provided that the characteristics and effects described in this application are achieved.

The disclosure includes a configuration that is substantially the same as the configuration described in the embodiments (for example, a configuration having the same function, method, and effect, or a configuration having the same object and effect). The disclosure also includes a configuration in which a non-essential part of the configurations described in the embodiments is replaced. The disclosure also includes a configuration having the same advantageous effect as the configurations described in the embodiments, or a configuration that can achieve the same object. The disclosure also includes a configuration in which a known technique is added to the configuration described in the embodiments.

The invention claimed is:

1. A light-emitting device comprising:
   a substrate;
   a laminated structure provided at the substrate and having a plurality of columnar parts; and
   an electrode provided on a side opposite to a side of the substrate, of the laminated structure,
   the columnar part having:
   a first semiconductor layer;
   a second semiconductor layer having a different electrical conductivity type from the first semiconductor layer; and
   an active layer provided between the first semiconductor layer and the second semiconductor layer,
   the laminated structure having:
   a light propagation layer provided between the active layers of the columnar parts that are next to each other;
   a first low-refractive-index part provided between the light propagation layer and the substrate and having a lower refractive index than a refractive index of the light propagation layer; and
   a second low-refractive-index part provided between the light propagation layer and the electrode and having a lower refractive index than the refractive index of the light propagation layer.

2. The light-emitting device according to claim 1, wherein the first low-refractive-index part is a void.

3. The light-emitting device according to claim 1, wherein,
the second low-refractive-index part is a void.

4. The light-emitting device according to claim 1, wherein,
the active layer contains gallium and nitrogen, and
the light propagation layer contains aluminum, gallium, and nitrogen.

5. The light-emitting device according to claim 1, wherein the refractive index of the light propagation layer is different from the refractive index of the active layer.

6. The light-emitting device according to claim 1, wherein
a difference between the refractive index of the active layer and the refractive index of the light propagation layer is smaller than a difference between the refractive index of the light propagation layer and a refractive index of air.

7. The light-emitting device according to claim 1, wherein the light propagation layer is provided between the first semiconductor layers of the columnar parts that are next to each other and between the second semiconductor layers of the columnar parts that are next to each other, and
a cross-sectional area in a direction orthogonal to a layer-stacking direction in which the first semiconductor layer and the active layer are stacked, between the active layers of the columnar parts that are next to each other, of the light propagation layer, is greater than a cross-sectional area in the orthogonal direction on the side of the substrate of the light propagation layer and greater than a cross-sectional area in the orthogonal direction on the side of the electrode of the light propagation layer.

8. The light-emitting device according to claim 1, wherein the laminated structure has a first insulating layer provided between the columnar part and the light propagation layer.

9. The light-emitting device according to claim 1, wherein the laminated structure has a second insulating layer provided between the light propagation layer and the electrode.

10. A projector comprising:
the light-emitting device according to claim 1.

11. A method for manufacturing a light-emitting device, the method comprising:
a step of forming a first semiconductor layer, an active layer, and a second semiconductor layer having a different electrical conductivity type from the first semiconductor layer, in this order at a substrate, and thus forming a plurality of columnar parts;
a step of embedding a predetermined material between the columnar parts that are next to each other, thus forming a light propagation layer between the active layers of the columnar parts that are next to each other, and forming a void between the substrate and the light propagation layer;
a step of etching the light propagation layer and thus forming a void between the second semiconductor layers of the columnar parts that are next to each other; and
a step of forming an electrode on a side opposite to a side of the substrate of the columnar part.

* * * * *